United States Patent
Daly et al.

(10) Patent No.: US 9,816,764 B2
(45) Date of Patent: Nov. 14, 2017

(54) EFFICIENT SELF COOLING HEAT EXCHANGER

(71) Applicant: UOP LLC, Des Plaines, IL (US)

(72) Inventors: Phillip F. Daly, Palatine, IL (US); Kurt M. Vanden Bussche, Lake in the Hills, IL (US)

(73) Assignee: UOP LLC, Des Plaines, IL (US)

( * ) Notice: Subject to any disclaimer, the term of this patent is extended or adjusted under 35 U.S.C. 154(b) by 375 days.

(21) Appl. No.: 14/034,500

(22) Filed: Sep. 23, 2013

(65) Prior Publication Data

US 2014/0020874 A1 Jan. 23, 2014

Related U.S. Application Data

(62) Division of application No. 13/397,716, filed on Feb. 16, 2012, now Pat. No. 8,555,954, which is a division of application No. 12/485,311, filed on Jun. 16, 2009, now Pat. No. 8,122,946.

(51) Int. Cl.

| | |
|---|---|
| *F28F 3/12* | (2006.01) |
| *F25J 1/00* | (2006.01) |
| *F25J 1/02* | (2006.01) |
| *F25J 5/00* | (2006.01) |
| *F28D 9/00* | (2006.01) |
| *F28F 13/00* | (2006.01) |
| *F28F 13/06* | (2006.01) |
| *H05K 7/20* | (2006.01) |
| *F28D 21/00* | (2006.01) |

(52) U.S. Cl.
CPC ............... *F28F 3/12* (2013.01); *F25J 1/0022* (2013.01); *F25J 1/0052* (2013.01); *F25J 1/0262* (2013.01); *F25J 5/002* (2013.01); *F28D 9/0031* (2013.01); *F28D 9/0037* (2013.01); *F28F 13/00* (2013.01); *F28F 13/06* (2013.01); *H05K 7/20272* (2013.01); *F25J 2290/44* (2013.01); *F28D 2021/0033* (2013.01); *F28F 2270/00* (2013.01)

(58) Field of Classification Search
CPC .... F28D 9/0031; F28D 9/0037; F28D 9/0043; F28D 9/0056; F28D 1/0341; F28D 2021/0033; F28F 3/12; F28F 13/00; F28F 13/06; F28F 2270/00; F25B 39/024; F25J 1/0022; F25J 1/0262; F25J 5/002; F25J 1/0052; F25J 2290/44; H05K 7/20272
See application file for complete search history.

(56) References Cited

U.S. PATENT DOCUMENTS

| | | | | |
|---|---|---|---|---|
| 5,479,707 | A * | 1/1996 | Alvarez | F25B 39/024 29/463 |
| 6,938,688 | B2 * | 9/2005 | Lengauer, Jr. | F24H 3/105 165/146 |
| 6,959,492 | B1 * | 11/2005 | Matsumoto | F28D 9/0075 165/135 |

(Continued)

*Primary Examiner* — Tho V Duong

(57) ABSTRACT

An inexpensive heat exchanger is disclosed, wherein the heat exchanger is made up of a plurality of plates and each plate has at least one channel defined in the plate. The plates are stacked and bonded together to form a block having conduits for carrying at least one fluid and where the exchanger includes an expansion device enclosed within the unit. The plates include construction to thermally insulate the sections of the heat exchanger to control the heat flow within the heat exchanger.

2 Claims, 3 Drawing Sheets

(56) References Cited

U.S. PATENT DOCUMENTS

| | | | |
|---|---|---|---|
| 7,213,638 B2 * | 5/2007 | Seiler | F02M 31/20 165/148 |
| 2005/0211427 A1 * | 9/2005 | Kenny | F28D 15/0266 165/299 |
| 2007/0068654 A1 * | 3/2007 | Chang | F28D 15/0233 165/104.21 |

* cited by examiner

EFFICIENT SELF COOLING HEAT EXCHANGER

CROSS-REFERENCE TO RELATED APPLICATIONS

This application is a Division of copending U.S. application Ser. No. 13/397,716 filed Feb. 16, 2012, which is a Division of U.S. application Ser. No. 12/485,311, filed Jun. 16, 2009, which issued on Feb. 28, 2012, as U.S. Pat. No. 8,122,946, the contents of which are hereby incorporated by reference in their entirety.

FIELD OF THE INVENTION

The present invention relates to the cooling of fluids through the self-cooling from the fluid. More particularly this invention goes to the cooling of a fluid to self-cool the fluid and to cool and, potentially, liquefy another fluid.

BACKGROUND OF THE INVENTION

The demands for natural gas have increased in recent years. The transport of natural gas is through pipelines or through the transportation on ships. Many areas where natural gas is located are remote in the sense that there are no convenient pipelines to readily transfer the natural gas to the market. Therefore natural gas is frequently transported by ship. The transport of natural gas on ships requires a means to reduce the volume and one method of reducing the volume is to liquefy the natural gas. The process of liquefaction requires cooling the gas to very low temperatures. There are several known methods of liquefying natural gas as can be found in U.S. Pat. Nos. 6,367,286; 6,564,578; 6,742,358; 6,763,680; and 6,886,362.

One of the methods is a cascade method using a number of shell and tube heat exchangers. Each of these shell and tube heat exchangers, is very large and very expensive, and presents problems of economics and feasibility for remote and smaller natural gas fields. It would be desirable to have a device for liquefying natural gas that is compact and relatively inexpensive to ship and use in remote locations, especially for natural gas fields found under the ocean floor, where collection and liquefaction of the natural gas can be performed on board a floating platform using a compact unit.

The most common commercial design of a heat exchanger for the cooling of natural gas is a spiral wound heat exchanger where the coolant cascades within a shell over spiral wound tubes carrying the gas to be cooled.

There is also an increasing demand for methods of cooling gases to condense them for transport or for separation purposes. Improvements over the current commercial design can include lower cost, lower weight, and provide a more compact structure as well as provide improved heat transfer characteristics.

BRIEF SUMMARY OF THE INVENTION

The present invention comprises a heat exchanger made up of one or more plates where each plate has at least one channel etched, milled, pressed, inflated, or otherwise formed in the plate. The channels each have an inlet and an outlet for admitting and withdrawing a cooling fluid. The channels each have an expansion device positioned within the channel, where the coolant is expanded and provides self-cooling for the coolant. The plates in the heat exchanger are bonded to form a cooling block, and can be used as a heat sink for devices external to the heat exchanger. The invention is designed to improve the efficiency of the heat exchanger, and includes channels for controlling the heat flow through the heat exchanger. One area for controlling the heat flow is limiting the heat flow from the area for heat exchange to the area for expanding the coolant. The heat flow is limited by providing insulating channels to divide regions of the heat exchanger plates. In particular, at least one insulating channel is disposed between the area for heat exchange and the area for expanding the fluid. The insulating channels can provide separation of large sections of the plates, or can control heat flow in smaller sections of the heat exchanger. In a second area, the channels carrying the coolant and fluid to be cooled can be designed to form a sinuous path within the plates. The paths can fold and form regions where sections of the same channel are substantially parallel, providing for undesirable heat transfer between sections of the channel. The invention includes insulating channels to thermally separate sections of the same channel, and, as such, improve the efficiency of the heat exchanger.

Other objects, advantages and applications of the present invention will become apparent to those skilled in the art from the following detailed description and drawings.

DETAILED DESCRIPTION OF THE INVENTION

The use of liquefied natural gas (LNG) is increasing, as fuel and a means of transporting natural gas from remote sites having natural gas, without a nearby gas pipeline, to more distant areas where the natural gas is consumed. Natural gas is typically recovered from gas wells that have been drilled and is in the gas phase at high pressure. The high pressure gas is then treated and passed to a pipeline for transport. However, there are an increasing number of natural gas fields that are in remote locations relative to natural gas pipelines. The present invention is directed to a heat exchanger for cooling the natural gas at the gas wells. By providing an inexpensive heat exchanger for cooling and liquefying natural gas in remote locations, natural gas can be recovered on site and transported as LNG, rather than requiring a natural gas pipeline, or transporting the gas at very high pressures. In addition, the present invention can be used as a means for cooling other materials, such as providing for a cooling device to cool electronics or other devices that generate heat and need external cooling.

The efficiency of the heat exchanger is affected by the heat transfer to the expansion device where a substantially adiabatic expansion is affected. The present invention is designed to reduce the undesirable heat flow from the heat transfer region to the expansion region of the heat exchanger. The creation of a barrier region to limit heat flow to the expansion region improves the thermodynamic efficiency of the expansion of the cooling fluid.

The plates have channels etched, milled, pressed, stamped, inflated, or by other methods known in the art, into them for the transport of coolant and fluid to be cooled. When the plates are bonded together, the channels are covered and form conduits through which fluids can flow. The bonding method will depend on the materials of construction, such as with aluminum plates, bonding involves brazing the aluminum plates together. With steel, diffusion bonding or welding can be performed to bond the steel plates together. Other means of bonding plates are known to those skilled in the art.

Figure 1:
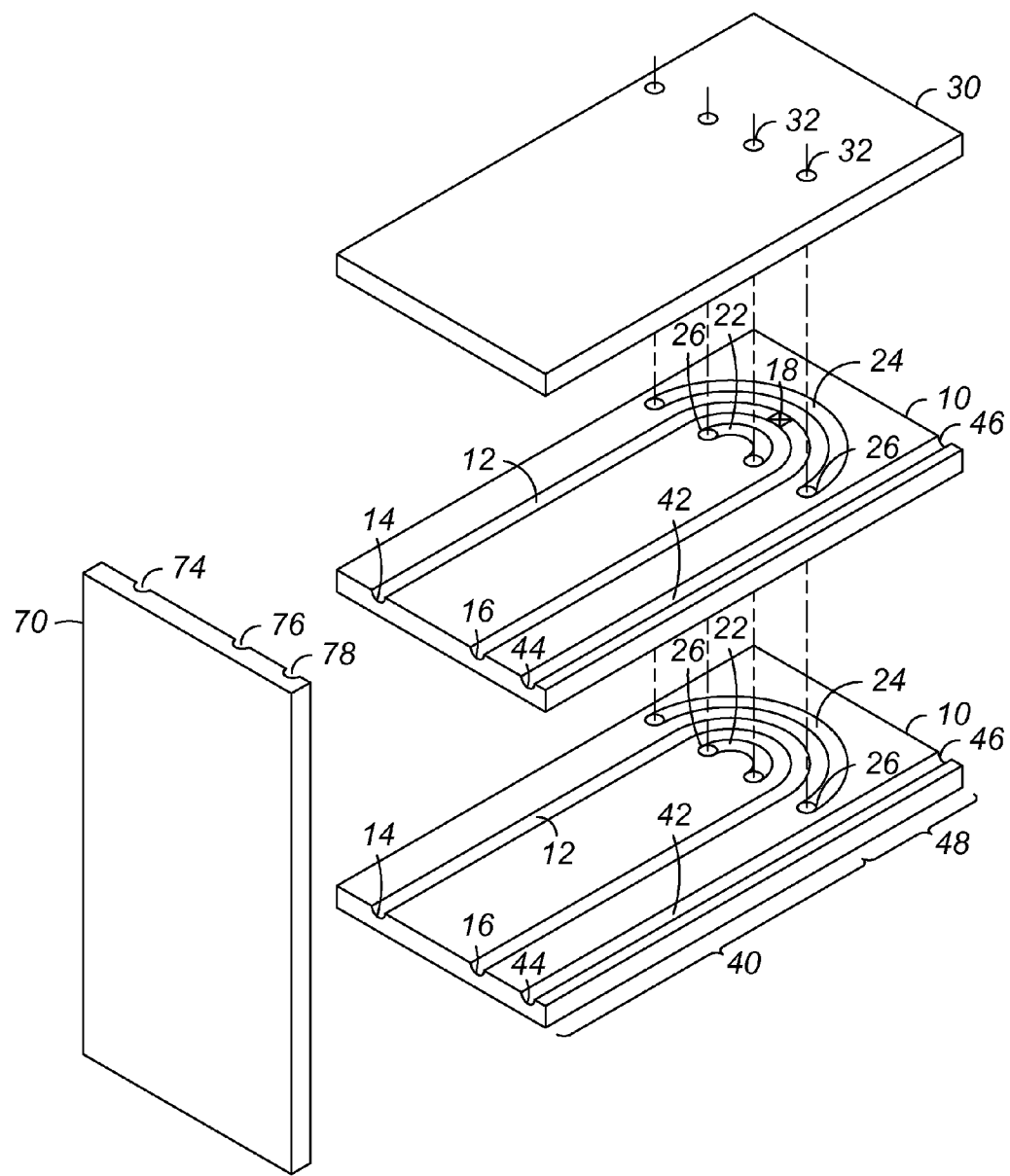
FIG. 1 is a schematic of a first embodiment showing the insulating channels around the expansion path.

The present invention presents a thermal barrier to limit the amount of heat flowing from the heat exchange section of the heat exchanger to the expansion section of the heat exchanger. The present invention, as shown in FIG. 1, is a heat exchanger that includes at least one first plate 10. The plate 10 has a first channel 12 defined therein having an inlet 14 and an outlet 16. The first channel 12 has three sections: a first section for carrying a cooling fluid, a second section having an expansion device where the cooling fluid is expanded, and a third section for carrying the expanded cooling fluid. The cooling fluid can also be termed a coolant or refrigerant. The heat exchanger plate has two regions, a heat exchange region which encompasses the first second of the first channel 12 and the third section of the first channel 12, and an expansion section which encompasses the second section of the first channel 12. The second section of the first channel 12 includes an expansion device 18 positioned within the second section of the channel. The first plate 10 also includes at least one insulating channel, but preferable a pair of insulating channels 22, 24. When there is a single insulating channel 22, the insulating channel is disposed between the second section of the first channel 12 and the heat exchange region of the plate 10. The insulating channels 22, 24 are defined in the plate 10 along a path that is substantially parallel to the second section of the first channel 12, and the insulating channels 22, 24 are in fluid isolation from the first channel 12. The heat exchanger includes a cover plate 30 to cover the channel 12 in the upper most plate 10 of a stack of plates.

The first plate 10 can be divided into two sections: a heat exchange section 40, and an expansion section 48. The insulating channels 22, 24 would be disposed in the expansion section 48, and the heat exchange section 40 is where heat transfer from a fluid being cooled to the expanded fluid takes place. In the heat exchange section 40, the third section of the first channel 12 is preferably substantially parallel to the first section of the first channel 12 to provide self-cooling of the incoming coolant.

The insulating channels 22, 24 can include an access port 32 to allow for external gas flow through the insulating channels 22, 24, or to allow for the injection of an insulating material into the channels 22, 24. For multiple plates 10, the insulating channels can include an opening 26 that passes through the plate 10. Other designs can include different paths for providing access to the insulating channels 22, 24. The insulating channels 22, 24 can be filled with a low conductivity gas, or an insulating material having a thermal conductivity of less than 0.1 W/m-K. Insulating materials can be chosen for the expected operational temperature ranges. Examples of insulating materials include perlite, cellular glass insulation, polyurethane insulation, polyisocyanurate insulation, fiberglass, polystyrene, and elastomeric foams. Some of these insulating materials are appropriate for temperatures near or below cryogenic temperature ranges, such as to temperatures as low as $-260°$ C. The inner insulation channel 22 can be enlarged to comprise a hole that extends through the plate 10, providing a larger volume of low conductivity. Likewise, with other insulating channels, when the design allows for the insulating channels to be enlarged and extended through each plate, the insulating channels can comprise holes within the plates.

The heat exchanger can include a manifold 70 having a manifold first inlet channel 74 in fluid communication with each first channel inlet 14, and a manifold first outlet channel 76 in fluid communication with each first channel outlet 16.

The heat exchanger can include a second channel 42 defined within the plate 10. The second channel 42 includes a second channel inlet 44 and a second channel outlet 46 for carrying a fluid to be cooled, and the second channel 42 is in fluid isolation from the first channel 12. The manifold 70 for carrying fluid to the heat exchanger can include a manifold second inlet channel 78 in fluid communication with each second channel inlet 44 and a manifold second outlet channel in fluid communication with each second channel outlet 46. Variations on the manifolds 70 include multiple manifolds, where each manifold used has a single channel to either distribute or collect fluids to and from the heat exchanger. Other variations include single manifolds per side of the heat exchanger, where each manifold has the appropriate number of channels for the side the manifold is mounted on the heat exchanger.

In one embodiment, the invention comprises a heat exchanger as described above, but with at least one second plate, and where the first and second plates are stacked in an alternating manner. The second plate has an insulating channel formed therein, where the second plate insulating channel is positioned under the expansion section of the first channel. This can be seen in FIG. 2, where the Figure shows a section of the heat exchanger. The section shows a first plate 10 with the expansion section of the first channel 12 and two insulating channels 22, 24 on either side of the expansion section of the first channel 12. The plates are stacked such that the second plate 50 is positioned below the first plate 10, and has a second plate insulating channel 52, and where the second plate insulating channel 52 is disposed below the first channel 12 expansion section. The second plate insulating channel 52 limits the amount of heat flow from the second plate through the heat exchange section. When the invention comprises multiple first 10 and second 50 plates, the expansion section of the first channel 12 has an insulating channel 52 above it and below it, as well as insulating channels 22 and 24 on either side. The width of the channel 52 in the second plate 50 is preferably greater than the width of the first channel 12 in the first plate 10. This provides more insulating capability for restricting the heat flow from the second plate 50 to the expansion region of the first plate 10. The insulating channel 52 in the second plate 50 can be filled with a low conductivity gas, or filled with an insulating material having a conductivity less than 0.1 W/m-K. An access channel can be defined in the second plate 50 in fluid communication with the insulating channel 52, for providing a means for filling the insulating channel 52 with an insulating material after the assembly of the heat exchanger. Examples of insulation materials are listed above, and the choice is dependent on the operational range of the heat exchanger.

Figures 2, 3:
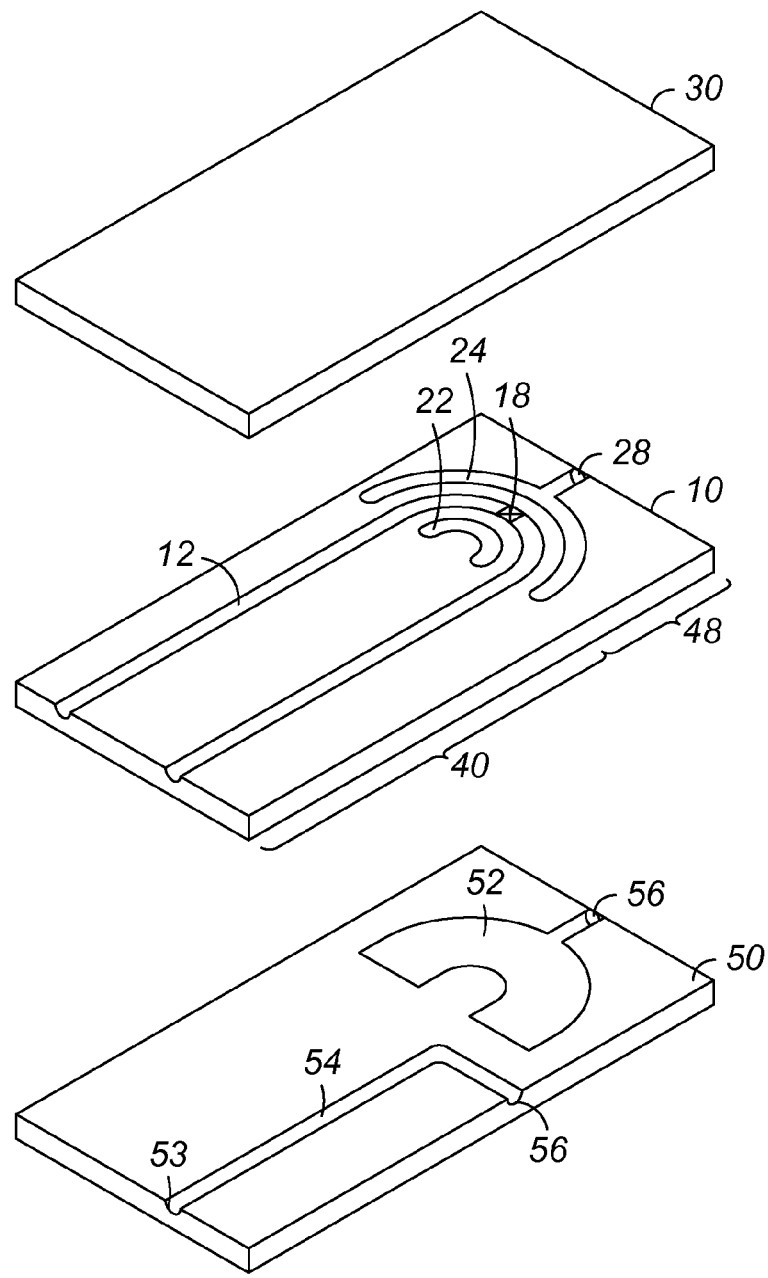
FIG. 2 is a schematic of a portion of the heat exchanger showing the first and second plates, and the insulating channels proximate to the expansion section of the first channel.
FIG. 3 is a schematic of the two plate design showing insulating channels.

The heat exchanger having pairs of first 10 and second 50 plates allows for a second fluid channel 54 in the second plate for carrying a fluid to be cooled, as shown in FIG. 3. In an alternate embodiment, the heat exchanger comprises a first plate 10 for carrying the coolant in a first channel 12. The coolant passes through the expansion section 48 of the plate 10 and is passed back to the heat exchange section 40.

The expansion section 48 is insulated by insulating channels 22 and 24 in the first plate 10. The second plate 50 includes a second channel 54 for carrying a fluid to be cooled, where the second channel has an inlet 53 and an outlet 56. The second plate includes an insulating channel 52 disposed proximate to the section of the first channel 12 after the coolant is expanded. The insulating channels are in fluid isolation from the channels carrying coolant and fluid to be cooled. The insulating channels can include access ports 28, 58 to the exterior of the heat exchanger when the exchanger is assembled.

The second channel 54 follows a substantially parallel path to the third section of the first channel 12. The insulating channel 52 provides a barrier to heat flow from the cooled fluid to the expansion region 48 of the first plate 10.

In an alternative to a manifold for the distribution and collection of fluid streams to and from the heat exchanger, the heat exchanger cover plate 30 can include a first channel inlet port in fluid communication with each first channel inlet 14, and a first channel outlet port in fluid communication with each first channel outlet 16. With this embodiment, in an alternative to terminating at the edge of a plate, the first channel inlets 14 pass through each plate 10 and are in fluid communication with the cover plate first channel inlet port. Likewise, the first channel outlets 16 pass through each plate 10 and are in fluid communication with the cover plate channel first channel outlet port. With this embodiment, the cover plate 30 can include second channel inlet ports in fluid communication with each second channel inlet 44 and second channel outlet ports in fluid communication with each second channel outlet 46, where each second channel inlet and outlet, instead of terminating at an edge of a plate 10 pass through each plate 10.

Figure 4:
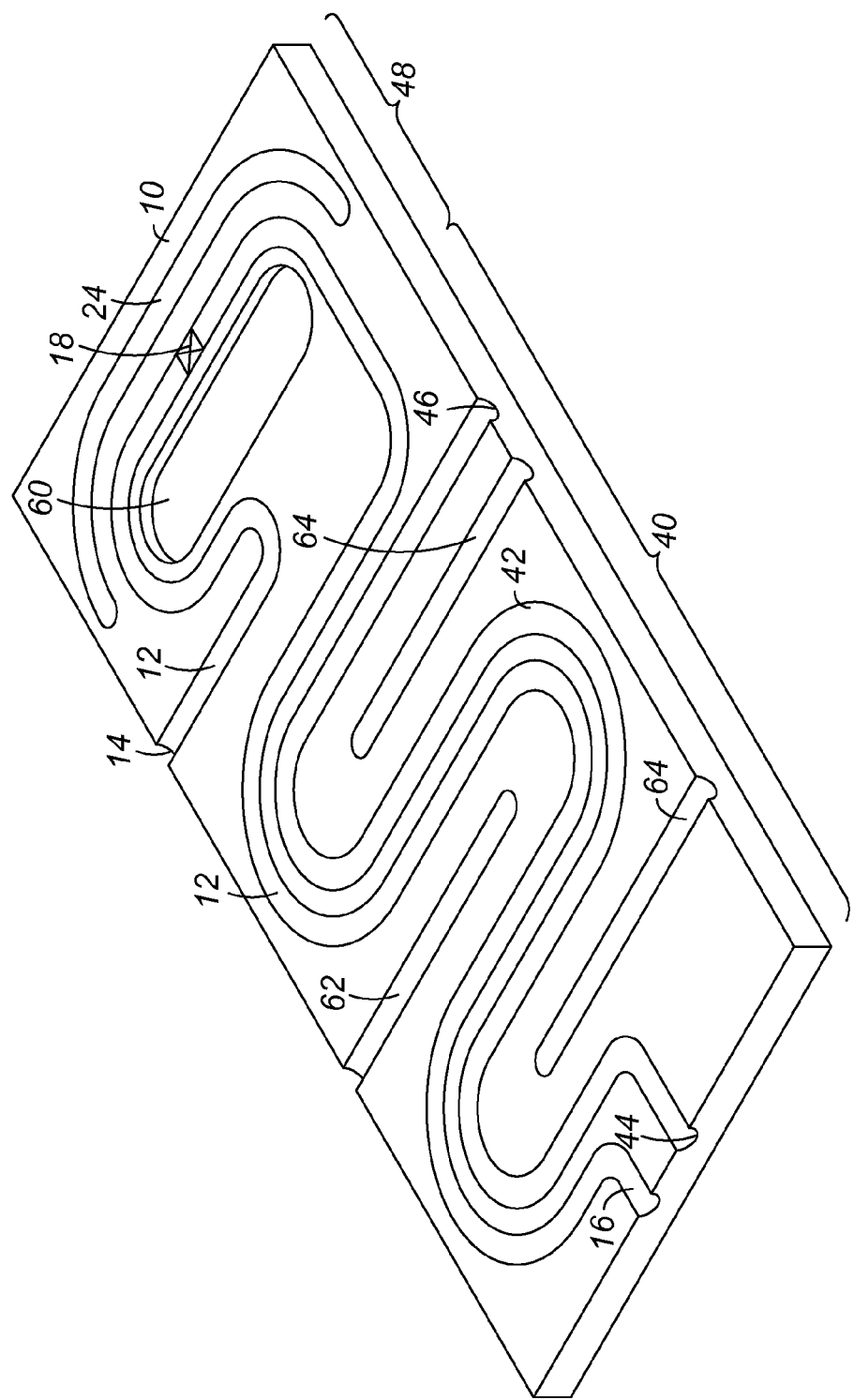
FIG. 4 is a schematic of one plate of the invention showing alternate positioning of the insulating channels.

The insulating channels can also be positioned to provide thermal separation of neighboring sections of any channels to limit thermal communication. The insulating channels can improve the effectiveness of the heat exchange zone between two neighboring channels by thermally isolating sections that fold in a sinuous pattern. An example of the further use of insulating channels is shown in FIG. 4. The heat exchanger comprises at least one plate 10 having a first channel 12 defined therein, and having an inlet 14 and an outlet 16. The plate 10 can be divided into two sections, a heat exchange section 40 and an expansion section 48, where the expansion section 48 is partially thermally insulated from the heat exchange section 40 by an insulating channel, or by an insulating region, such as a hole 60 through the plate 10. The hole 60 can be filled with a low conductivity gas, or an insulating material.

The first channel 12 follows a sinuous path, where there is a first section for carrying a coolant. The first channel 12 then passes through a second section that is disposed within the expansion section 48 of the plate 10. The first channel 12 continues back to the heat exchange section 40 where the first channel 12 follows a sinuous path to provide a longer heat exchange path for the coolant. The sinuous path of the first channel 12 folds back on itself, and is separated by a insulating channel 62 to limit the heat flow between neighboring sections of the first channel 12. The first channel 12 can include an insulating channel 24 that is substantially parallel to the first channel 12 in the expansion region 48 around the section including an expansion device 18.

The plate 10 can further include a second channel 42 defined therein, and having an inlet 44 and an outlet 46. In one design, the second channel 42 follows a path that is substantially parallel to the third section of the first channel 12 in the heat exchange section 40 of the plate. The sinuous path has the second channel 42 folding back on itself, and to prevent heat transfer between neighboring portions of the second channel 42, insulating channels 64 are defined in the plate 10.

In an alternate design, the heat exchanger can further include at least one second plate 50, where the first 10 and second plates 50 are stacked in an alternating arrangement. In the alternate design, the second channel 42 is disposed on the second plate 50, instead of the first plate 10. The second channel 42 can follow a substantially parallel path to the first channel 12 in the first plate 10, and the sections of the first 12 and second 42 channels that fold back upon themselves can be separated by insulating channels.

The present invention can comprise complex geometric arrays of channels for cooling a fluid, where there are additional insulating channels to reduce cross heating of channels when undesired. Upon reading this description, one skilled in the art can contemplate many geometric arrays that fall within the scope of the invention. This insulating channel invention is intended to apply to heat exchanger designs that also do not include an expansion device within the exchanger.

While the invention has been described with what are presently considered the preferred embodiments, it is to be understood that the invention is not limited to the disclosed embodiments, but it is intended to cover various modifications and equivalent arrangements included within the scope of the appended claims.

The invention claimed is:

1. A heat exchanger comprising:
at least one plate having a first channel defined therein, the first channel having an inlet and an outlet; and
at least one insulating channel defined therein, and where the insulating channel is disposed between substantially parallel sections of the first channel wherein said heat exchanger is further comprising a second channel separate from the first channel defined by the at least one plate the second channel having an inlet and an outlet, wherein the first and second channel follow substantially parallel sinuous paths and are capable of containing two different streams, and where the insulating channel is disposed between substantially parallel sections of either the first channel or the second channel
and wherein said heat exchanger is further comprising a hole that is capable of insulation extending through the plate, thereby separating the plate into a heat exchange region and an expansion region to allow expansion of flow.

2. A heat exchanger comprising:
at least one plate having a first channel defined therein, the first channel having an inlet and an outlet; and
at least one insulating channel defined therein, where the insulating channel is disposed between substantially parallel sections of the first channel wherein said heat exchanger is further comprising at least one second plate having a second channel separate from the first channel defined by a second plate the second channel having an inlet and an outlet, wherein the first and second channel follow substantially parallel sinuous paths and are capable of containing two different streams, and where the insulating channel is disposed between substantially parallel sections of either the first channel or the second channel; and
wherein said heat exchanger further comprises a hole that is capable of insulation extending through the plate, thereby separating the plate into a heat exchange region and an expansion region to allow expansion of flow.

* * * * *